(12) United States Patent
Yahiro

(10) Patent No.: US 6,861,187 B2
(45) Date of Patent: Mar. 1, 2005

(54) METHODS AND DEVICES FOR EVALUATING IMAGING CHARACTERISTICS OF A CHARGED-PARTICLE-BEAM MICROLITHOGRAPHY SYSTEM

(75) Inventor: Takehisa Yahiro, Ageo (JP)

(73) Assignee: Nikon Corporation, Tokyo (JP)

(*) Notice: Subject to any disclaimer, the term of this patent is extended or adjusted under 35 U.S.C. 154(b) by 36 days.

(21) Appl. No.: 10/236,681

(22) Filed: Sep. 5, 2002

(65) Prior Publication Data

US 2003/0085365 A1 May 8, 2003

(30) Foreign Application Priority Data

Sep. 5, 2001 (JP) ........................................ 2001-268321

(51) Int. Cl.$^7$ ............................. G03F 9/00; G03C 5/00; G01K 1/08
(52) U.S. Cl. ........................ 430/30; 430/296; 430/942; 250/396 R; 250/397; 250/492.2; 250/492.21; 250/492.22; 250/492.23; 250/492.3; 355/55; 355/67; 355/77
(58) Field of Search .................. 430/30, 296, 942; 250/492.2, 492.21, 492.22, 492.23, 492.3, 396 R, 397; 355/55, 67, 77

(56) References Cited

U.S. PATENT DOCUMENTS

| | | | | |
|---|---|---|---|---|
| 5,396,077 A | * | 3/1995 | Sohda et al. | ............. 250/492.2 |
| 5,939,725 A | * | 8/1999 | Muraki | ................... 250/492.22 |
| 6,140,654 A | * | 10/2000 | Nakasugi et al. | ......... 250/491.1 |
| 6,327,025 B1 | * | 12/2001 | Imai | ............................. 355/53 |
| 6,352,799 B1 | * | 3/2002 | Nakasuji | ......................... 430/5 |
| 6,403,971 B1 | * | 6/2002 | Kawata | .................... 250/491.1 |
| 6,441,384 B1 | * | 8/2002 | Kojima | .................. 250/492.23 |
| 6,521,392 B2 | | 2/2003 | Yahiro | ......................... 430/296 |
| 6,522,386 B1 | * | 2/2003 | Nishi | ........................... 355/52 |
| 6,538,255 B1 | * | 3/2003 | Nakasuji | ................ 250/492.23 |
| 6,635,402 B2 | | 10/2003 | Yahiro | ......................... 430/296 |
| 2002/0113214 A1 | | 8/2002 | Yahiro | ..................... 250/492.1 |
| 2003/0075690 A1 | | 4/2003 | Yahiro | ..................... 250/491.1 |

* cited by examiner

Primary Examiner—Christopher G. Young
(74) Attorney, Agent, or Firm—Klarquist Sparkman, LLP

(57) ABSTRACT

Methods and devices are disclosed for evaluating the imaging performance of a charged-particle-beam (CPB) microlithography system. An embodiment of such a device includes a knife-edged pattern region defining multiple knife-edged apertures that are longitudinally extended. Each aperture includes a respective knife-edge on each of its two respective longitudinal edges. A charged particle beam having a rectangular transverse profile is scanned across the apertures such that the beam reaches a knife-edge on an adjacent aperture before the previous knife-edge exhibits radiation-induced deterioration. Furthermore, each of the knife-edges can be swept multiple times by respective beam scans performed at different locations in the longitudinal direction. Hence, measurements can be performed many times (e.g., hundreds of times) using a single knife-edged pattern region.

20 Claims, 6 Drawing Sheets

METHODS AND DEVICES FOR EVALUATING IMAGING CHARACTERISTICS OF A CHARGED-PARTICLE-BEAM MICROLITHOGRAPHY SYSTEM

FIELD

This disclosure pertains to microlithography, which is a key technology used in the manufacture of micro-electronic devices such as semiconductor integrated circuits, displays, and the like. More specifically, the disclosure pertains to microlithography performed using a charged particle beam such as an electron beam or ion beam. Even more specifically, the disclosure pertains to methods and devices for evaluating and measuring the imaging performance of a charged-particle-beam (CPB) microlithography apparatus. The subject methods and devices allow the distribution of beam blur to be measured very accurately and repeatedly over an extended period of time.

BACKGROUND

Charged-particle-beam (CPB) microlithography systems (e.g., electron-beam projection-exposure systems) exhibit good imaging resolution but have limits on maximum obtainable throughput (processing speed). Various approaches have been investigated to increase the throughput of these systems. One approach is to increase the area of the pattern portion that can be projection-exposed in one "shot." Increasing the exposure area raises concerns with beam blur, which poses a need for devices for measuring beam blur and for adjusting the beam so as to reduce blur. For example, blur can be reduced by adjusting one or more of the focal point, astigmatism, magnification, rotation, and other parameters of the beam. Measurements of these parameters can be correlated to overall imaging performance of the system.

Imaging performance as affected by beam blur can be evaluated by either a backscattered-electron (BSE) detection system or a transmitted-electron (TE) detection system. A conventional TE detection system is summarized below and depicted in FIGS. 7 and 8(A)–8(B). Specifically, FIG. 7 is a schematic elevational section, with block diagram, of a conventional device utilizing an electron beam and a knife-edge. FIGS. 8(A)–8(B) are respective plan views of the knife-edged opening used in the device of FIG. 7. FIG. 8(A) depicts the knife-edged opening during beam irradiation, and FIG. 8(B) depicts the knife-edged opening after irradiation-induced contamination has accumulated on the knife-edge.

Referring first to FIG. 7, at the extreme upstream end of the device an illumination-beam source (not shown) is disposed. The illumination-beam source produces an electron beam EB that propagates in a downstream direction to a reticle (not shown) that defines a measurement pattern. The reticle can be the same reticle that defines an actual pattern to be exposed lithographically onto a substrate, or a separate measurement reticle. Downstream of the reticle is an aperture plate 100 defining a single knife-edged reference mark 101, as shown in FIG. 8(A). The electron beam EB is "patterned" by transmission through the upstream measurement pattern on the reticle to have a rectangular transverse profile. The beam EB is incident on the knife-edged reference mark 101 of the aperture plate 100. An electron detector (sensor) 105 is disposed downstream of the knife-edged reference mark 101.

As the rectangular beam EB is scanned in the direction indicated by the arrow in FIG. 7 (to the right in the figure), electrons that strike the non-open portion of the knife-edged reference mark 101 (i.e., electrons that strike the aperture plate 100) are absorbed by the aperture plate 100. Electrons that pass through the opening 102 defined in the aperture plate 100 are detected by the electron detector 105.

The beam current corresponding to the electrons e1 detected by the electron detector 105 is amplified by a preamplifier 106 and converted to a percentage-change-versus-time signal by a differentiating circuit 107. The output wavefront from the differentiating circuit 107 is routed to an oscilloscope 108 or other suitable display. Beam blur is determined from the output waveform, and beam adjustments (e.g., calibration of focal point, astigmatism, magnification, rotation, and various other corrections) are performed as required, based on evaluations of the beam blur so as to improve imaging performance. This method of measuring beam blur is disclosed, for example, in Japan Kôkai (published) Patent Document No. Hei 10-289851 and Japan Patent Application No. 2000-12620.

Unfortunately, the conventional beam-blur-measurement device summarized above is subject to contamination that interferes with proper functioning of the device. As shown in FIG. 8(B), contamination 110 accumulates on the knife-edged reference mark 101 whenever the knife-edge is irradiated for an extended period of time. Contaminant accumulation deteriorates the performance of the knife-edged reference mark 101 and reduces the accuracy of the beam-blur measurements obtained using the device. The contaminant problem can be cured by replacing the knife-edge, but such replacement requires disassembling the device and consequent exposure of the components thereof to air. Having to perform such maintenance on a regular basis substantially reduces the operational efficiency of the microlithography apparatus, and reduces the throughput realized using the apparatus.

SUMMARY

In view of the shortcomings of the prior art as summarized above, the present invention provides, inter alia, improved methods and devices for evaluating the imaging performance of a charged-particle-beam (CPB) microlithographic-exposure apparatus. The subject devices and methods allow beam blur to be measured very accurately over extended periods of time.

According to a first aspect of the invention, methods are provided (in the context of a CPB microlithography method in which a pattern is transferred from a reticle to a lithographic substrate by projecting a charged particle beam, carrying an image of the pattern, through a CPB optical system to the substrate on which the beam is focused so as to imprint an image of the pattern on the substrate) for measuring beam blur. An embodiment of such a method includes a first step in which a reticle defining a measurement opening is disposed at an object plane of the CPB optical system. The measurement opening has a longitudinal dimension that, as the charged particle beam passes through the measurement opening, provides the beam with a longitudinal transverse dimension. A knife-edged plate is disposed at an image plane of the CPB optical system. The knife-edged plate defines: (a) at least one knife-edged opening having longitudinal edges dimensioned at least 2× the longitudinal dimension of the charged particle beam, and/or (b) multiple knife-edged openings each having respective longitudinal edges dimensioned at least as long as the longitudinal dimension of the charged particle beam. In either event, each longitudinal edge has a respective knife-edge. A charged particle beam is directed through the measurement opening and through a selected region of the knife-edged opening, while scanning the beam across at least a portion of the respective longitudinal edges. The charged particle beam propagating downstream of the knife-edged opening is detected so as to obtain data concerning a blur characteristic of the beam. Before any significant radiation-induced contamination has accumulated on a just-scanned knife-edge, the charged particle beam is shifted such that the beam: (a) is scanned across a different portion of the respective longitudinal edges in a subsequent scan, and/or (b) is scanned across the respective longitudinal edges of a different knife-edged opening in a subsequent scan, respectively. By "significant" is meant an amount of radiation-induced contamination sufficient to cause a deterioration of measurement accuracy or precision that exceeds pre-determined specifications.

In the foregoing method, the at least one knife-edged opening can be a respective longitudinally extended opening defined in a thin film of silicon. In this instance the method can further comprise the step of disposing at least one beam-limiting-aperture plate between the knife-edged opening and the sensor. The beam-limiting-aperture plate defines at least one beam-limiting aperture situated and configured to pass substantially only charged particles of the beam that were not scattered upon passing through the thin film of silicon. The beam, that already has passed through a knife-edged opening, is passed through the beam-limiting aperture to the sensor. The beam-limiting-aperture plate can define a respective beam-limiting aperture corresponding to each knife-edged opening. Also, the step of disposing at least one beam-limiting-aperture plate can comprise disposing multiple beam-limiting-aperture plates in tandem between the knife-edged opening and the sensor. "In tandem" means in sequential order along an axis parallel to an optical axis of the CPB optical axis, such that the beam has to pass through one beam-limiting-aperture plate and then the other beam-limiting-aperture plate as the beam propagates to the sensor.

Alternatively, the method can further comprise the steps of disposing at least one beam-limiting-aperture plate between the knife-edged opening and the sensor, wherein the beam-limiting-aperture plate defines at least one beam-limiting aperture situated and configured to pass substantially only non-scattered charged particles of the beam passing through the knife-edged opening. In this instance, the beam (that already has passed through a knife-edged opening) is passed through the beam-limiting aperture to the sensor.

According to another aspect of the invention, devices are provided (in the context of a CPB microlithography system used for transferring a pattern from a reticle to a lithographic substrate by projecting a charged particle beam, carrying an image of the pattern, through a CPB optical system to the substrate on which the beam is focused so as to imprint an image of the pattern on the substrate) for measuring beam blur of the system. An embodiment of such a device comprises a reticle, defining a measurement opening, situated at an object plane of the CPB optical system. The measurement opening has a longitudinal dimension that, as the charged particle beam passes through the measurement opening, provides the beam with a longitudinal transverse dimension. The device also includes a knife-edged plate situated at an image plane of the CPB optical system. The knife-edged plate defines: (a) at least one knife-edged opening having longitudinal edges dimensioned at least 2× the longitudinal dimension of the charged particle beam, and/or (b) multiple knife-edged openings each having respective longitudinal edges dimensioned at least as long as the longitudinal dimension of the charged particle beam. In any event, each longitudinal edge has a respective knife-edge. The device also includes a sensor situated downstream of the knife-edged plate so as to detect the charged particle beam that has passed through the measurement opening and through a knife-edged opening as the beam is being scanned across a knife-edged opening.

The device can further comprise at least one stage of a beam-limiting-aperture plate situated between the knife-edged plate and the sensor. The beam-limiting-aperture plate defines at least one beam-limiting aperture situated and configured to pass substantially only non-scattered charged particles of the beam passing through the knife-edged opening.

As noted above, the at least one knife-edged opening can be a respective longitudinally extended opening defined in a thin film of silicon. In this instance the device can include at least one beam-limiting-aperture plate between the knife-edged opening and the sensor. The beam-limiting-aperture plate defines at least one beam-limiting aperture situated and configured to pass substantially only charged particles of the beam that were not scattered upon passing through the thin film of silicon.

By way of example, the knife-edged plate can define multiple sets of at least one knife-edged opening per set, wherein each opening has longitudinal edges dimensioned at least 5× longer than the longitudinal dimension of the charged particle beam. By way of another example, the knife-edged plate can define multiple sets of multiple knife-edged openings each having respective longitudinal edges dimensioned at least 2× longer than the longitudinal dimension of the charged particle beam.

According to another aspect of the invention, CPB microlithography apparatus are provided that comprise a beam-blur-measurement device as summarized above.

According to yet another aspect of the invention, CPB microlithography systems are provided. An embodiment of such a system comprises a projection-optical system configured to be situated between a reticle and a lithographic substrate and to project an image of a pattern, defined on the reticle, onto the substrate. The system also includes a wafer stage situated downstream of the projection-optical system and configured to hold the substrate during lithographic exposure with the charged particle beam passing through the projection-optical system. The system also includes a beam-blur-measurement device that comprises a knife-edged plate situated at an image plane of the projection-optical system and configured to receive a charged particle beam that has been trimmed to have a longitudinal transverse dimension. The knife-edged plate defines: (a) at least one knife-edged opening having longitudinal edges dimensioned at least 2× the longitudinal dimension of the charged particle beam, and/or (b) multiple knife-edged openings each having respective longitudinal edges dimensioned at least as long as the longitudinal dimension of the charged particle beam. In either event, each longitudinal edge has a respective knife-edge. The beam-blur-measurement device also includes a sensor situated downstream of the knife-edged plate so as to detect the charged particle beam that has passed through the measurement opening and through a knife-edged opening as the beam is being scanned over a knife-edged opening.

In this system the beam-blur-measurement device can further comprise at least one stage of a beam-limiting-aperture plate situated between the knife-edged plate and the sensor. The beam-limiting-aperture plate defines at least one beam-limiting aperture situated and configured to pass substantially only non-scattered charged particles of the beam passing through the knife-edged opening.

The beam-blur-measurement device can further comprise processing means connected to the sensor. The processing means is configured too calculate an imaging characteristic of the charged particle beam based on data provided by the sensor to the processing means.

The system can further comprise a measurement reticle, defining a measurement opening, situated at an object plane of the CPB optical system. The measurement opening has a longitudinal dimension that, as the charged particle beam passes through the measurement opening, provides the beam with a longitudinal transverse dimension.

In the various aspects summarized above, either (a) numerous knife-edged openings are provided, or (b) each knife-edged opening has a longitudinal dimension that is longer than the longitudinal dimension of the charged particle beam. Alternatively, both features (a) and (b) are provided. These features allow the location on the knife-edge actually scanned by the beam to be changed before significant radiation-induced contamination accumulates on any portion of a knife-edge. This allows blur measurements to be performed with an optimally configured knife-edge over an extended period of time, thereby reducing the frequency with which the knife-edge needs to be replaced or cleaned. This also improves throughput of the subject CPB microlithography system and allows the system to operate at optimal performance for longer periods of time.

By disposing at least one beam-limiting-aperture plate between the knife-edged opening and the sensor, high-precision and high-contrast measurements of beam blur can be performed. The beam-limiting-aperture plate may be configured advantageously as a single stage, but even higher contrast is obtained if multiple stages are used.

Providing multiple beam-limiting apertures allows the number of usable measurement locations to be increased according to the number of beam-limiting apertures. For instance, it is possible to provide 10,000 or more beam-blur measurement locations in each of the X and Y directions.

The foregoing and additional features and advantages of the invention will be more readily apparent from the following detailed description, which proceeds with reference to the accompanying drawings.

BRIEF DESCRIPTION OF THE DRAWINGS

FIGS. 8(A)–8(B) depict certain aspects of operation of a conventional beam-blur-measurement device, wherein FIG. 8(A) is a plan view of the knife-edged aperture during beam irradiation, and FIG. 8(B) is a plan view of the knife-edged aperture after accumulation on the knife-edge of radiation-induced contamination.

DETAILED DESCRIPTION

The invention is described below in the context of representative embodiments that are not intended to be limiting in any way. Also, the descriptions below are made in the context of using an electron beam as a charged particle beam. It will be understood that the general principles described herein can be applied with equal facility to use of an alternative type of charged particle beam, such as an ion beam.

Figure 2:
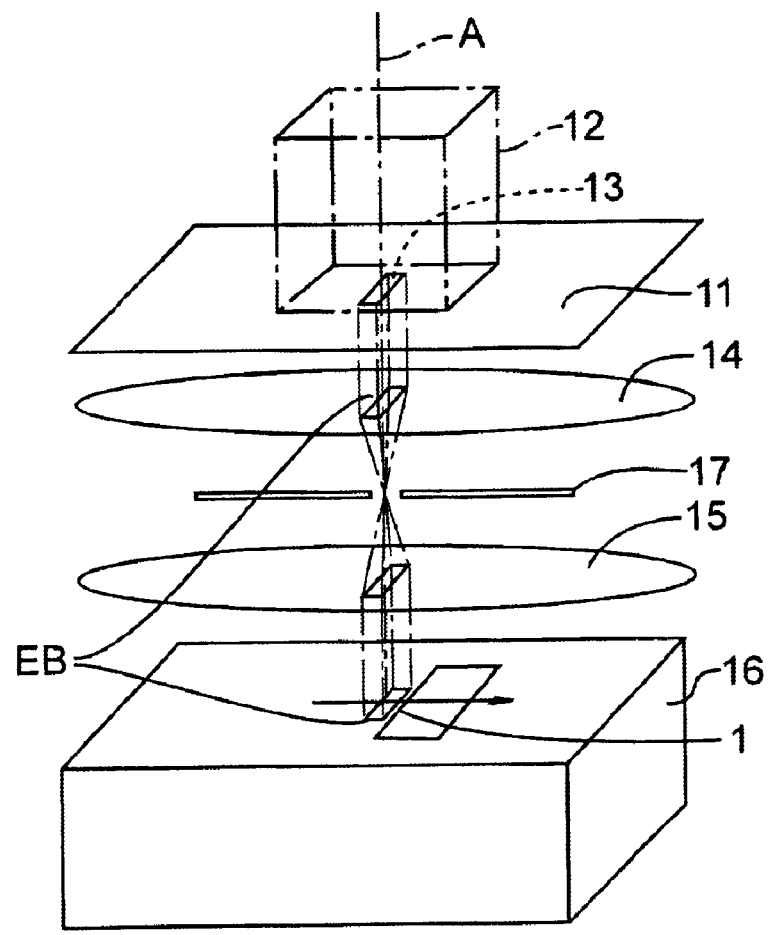
FIG. 2 is a schematic oblique view of certain components of a CPB microlithography system according to a representative embodiment, and of certain details of beam shaping and scanning for purposes of measuring beam blur.

Reference is made first to FIG. 2, which shows an illumination beam 12 and a reticle 11 situated generally upstream in the figure. The illumination beam 12 is emitted from an electron gun (not shown but understood to be situated further upstream) and shaped by an illumination-optical system (not shown) situated between the electron gun and the reticle 11. The reticle 11 can be a dedicated "measurement" reticle or can be the same reticle as used to define a pattern to be transferred to a lithographic substrate. In any event, the reticle 11 defines a measurement opening 13 (desirably rectangular in profile). By passing through the measurement opening 13 the illumination beam 12 is trimmed and shaped to form a beam EB having a corresponding (rectangular) transverse profile with straight longitudinal edges.

Downstream of the reticle 11 is a two-stage projection-optical system comprising first and second projection lenses 14, 15, respectively. A contrast aperture 17 is situated between the projection lenses 14, 15, centered on the optical axis A of the system. The beam EB propagating from the measurement opening 13 in the reticle 11 is converged by the first projection lens 14 to form a crossover at the contrast aperture 17. The contrast aperture 17 trims outlying portions of the beam EB that were scattered during transmission through the reticle 11.

A substrate stage 16 (also termed "wafer stage") is situated downstream of the second projection lens 15. The upstream-facing surface of the wafer stage 16 includes a mark having a longitudinal knife-edge 1. Also situated on the upstream-facing surface of the wafer stage 16 is a wafer chuck (not shown) that holds the lithographic substrate ("wafer") during normal transfer-exposure of a pattern from the reticle. Deflectors in the projection-optical system scan the electron beam EB in a lateral direction (arrow) over the knife-edge 1.

Figure 3:
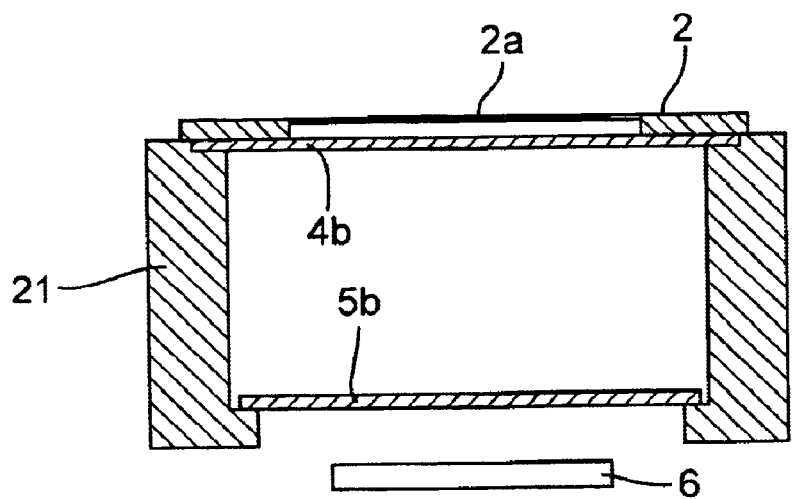
FIG. 3 is a schematic elevational section of a representative embodiment of a device for measuring beam blur in a CPB microlithography system.

Turning now to FIG. 3, a representative embodiment of a device for measuring beam blur is depicted schematically in elevational section. The depicted device includes a knife-edged plate 2, defining a plurality of knife-edges 1 (discussed below with reference to FIG. 4), situated upstream (top in the figure). The depicted portion of the knife-edged plate 2 includes a silicon thin-film 2a (desirably square in profile and having a thickness of approximately 2 $\mu$m, for example). A first beam-limiting-aperture plate 4b (having a planar configuration and defining multiple beam-limiting apertures 4 (see FIG. 5)) is situated downstream of the knife-edged plate 2. The axial distance between the first beam-limiting-aperture plate 4b and the knife-edged plate 2 is about 1 mm. A second beam-limiting-aperture plate 5b (having a planar configuration and defining multiple beam-limiting apertures 5 (see FIG. 5)) is situated downstream of the first beam-limiting-aperture plate 4b. The axial distance between the second beam-limiting-aperture plate 5b and the knife-edged plate 2 is several tens of millimeters. Each of the beam-limiting-aperture plates 4b, 5b is a respective conductive-metal plate having sufficient thickness (e.g., 1 mm) to absorb incident electrons. The respective peripheries of the knife-edged plate 2 and of each of the beam-limiting-aperture plates 4b, 5b are affixed to a cylindrical housing 21 made of, for example, a rigid ceramic material.

An electron detector (sensor) 6 is situated downstream of the second beam-limiting-aperture plate 5b. The electron detector 6 can be, for example, a Faraday cup, a solid-state detector, or a combination of a scintillator and a photomultiplier.

Figure 4A:
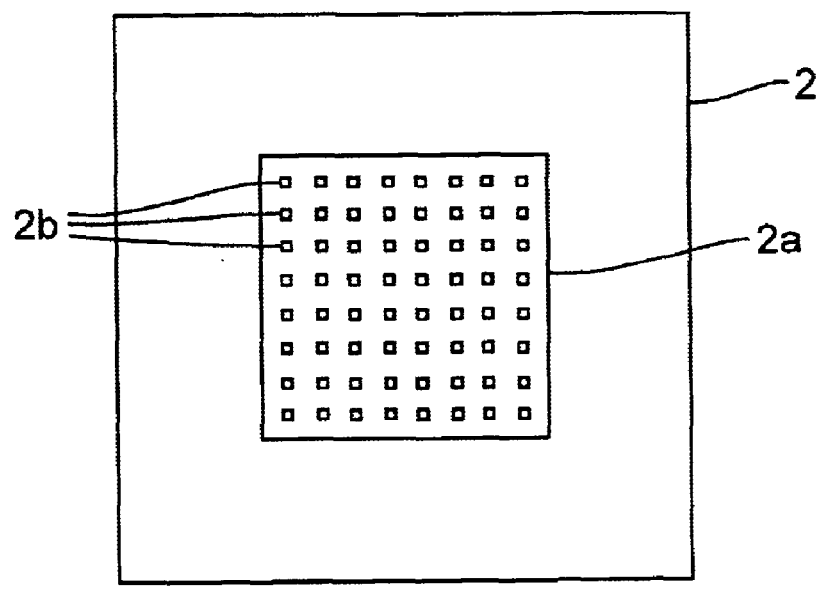
FIG. 4(A) is a plan view of an embodiment of a knife-edged plate.
Figure 4B:
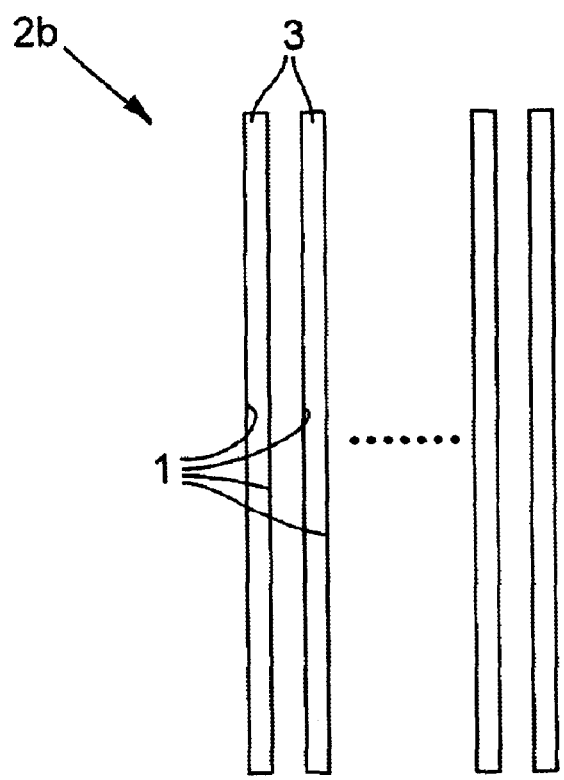
FIG. 4(B) is a plan view of one knife-edged-pattern region of the knife-edged plate of FIG. 4(A).

FIG. 4(A) is a plan view of the knife-edged plate 2, and FIG. 4(B) is a plan view of one knife-edged pattern region of the knife-edged plate 2. The knife-edged plate 2 shown in FIG. 4(A) is square in profile, but this profile is not intended to be limiting. As mentioned above, the central portion of the knife-edged plate 2 comprises a silicon thin-film 2a having a thickness of approximately 2 μm, for example, and defining multiple knife-edged pattern regions 2b. In the depicted embodiment, a total of 64 knife-edged pattern regions are provided (arranged in an 8×8 array) in the thin-film 2a. By way of example, each of the knife-edged pattern regions 2b in this embodiment is 50-μm square.

As shown in FIG. 4(B), openings 3 each having a width of 0.4 μm and a length (longitudinal direction) of 50 μm are defined in each of the knife-edged pattern regions 2b. Most of the openings 3 are not shown in the figure; actually, in this embodiment, each knife-edged pattern region 2b includes fifty openings 3 disposed in a respective row. The area between each pair of adjacent openings 3 is a thin-film region having a respective width of 0.6 μm. As described in detail below, the respective "left" and "right" longitudinal edges of each of the openings 3 as shown are respective knife-edges 1 and are used for measuring beam blur.

Figure 5:
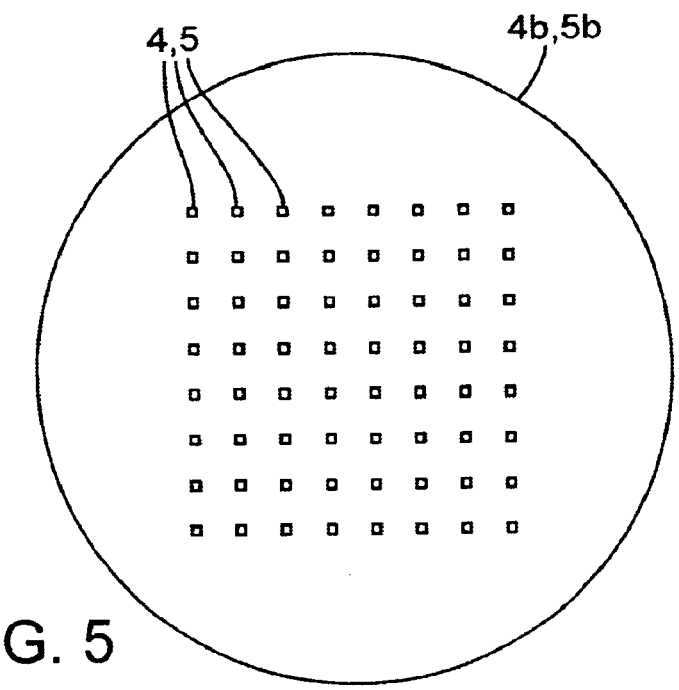
FIG. 5 is a plan view of an embodiment of a beam-limiting-aperture plate.

FIG. 5 is a plan view of a beam-limiting-aperture plate 4b, 5b. In this embodiment, each of the plates 4b, 5b is circular in profile. Multiple respective beam-limiting apertures 4, 5 are defined in each plate 4b, 5b. In the depicted embodiment a total of 64 respective apertures (arranged in an 8×8 array) are defined in the central region of each plate 4b, 5b. The beam-limiting apertures 4, 5 have respective locations on the plates 4b, 5b, respectively, that correspond to respective locations of corresponding knife-edged pattern regions 2b on the knife-edged plate 2, as shown in FIG. 4(A). In this embodiment, the outside diameters of the beam-limiting-aperture plates 4b, 5b are substantially equal, but the respective sizes of the beam-limiting apertures 4, 5 formed in the plates are not equal. For example, the apertures 4 in the first beam-limiting-aperture plate 4b are about 60-μm square, while the apertures 5 in the second beam-limiting-aperture 5b are about 200-μm square.

Figure 6:
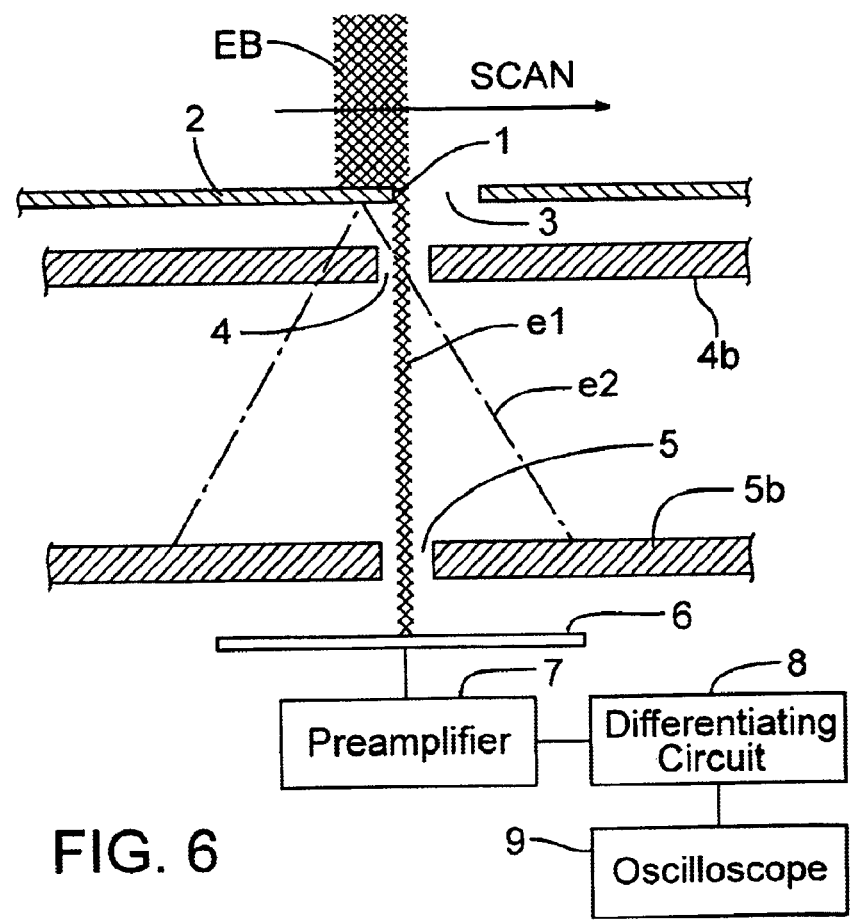
FIG. 6 is a schematic elevational view (with sections and associated block diagram) depicting operation of an embodiment of the beam-blur-measurement device for a CPB microlithography system.
Figure 7:
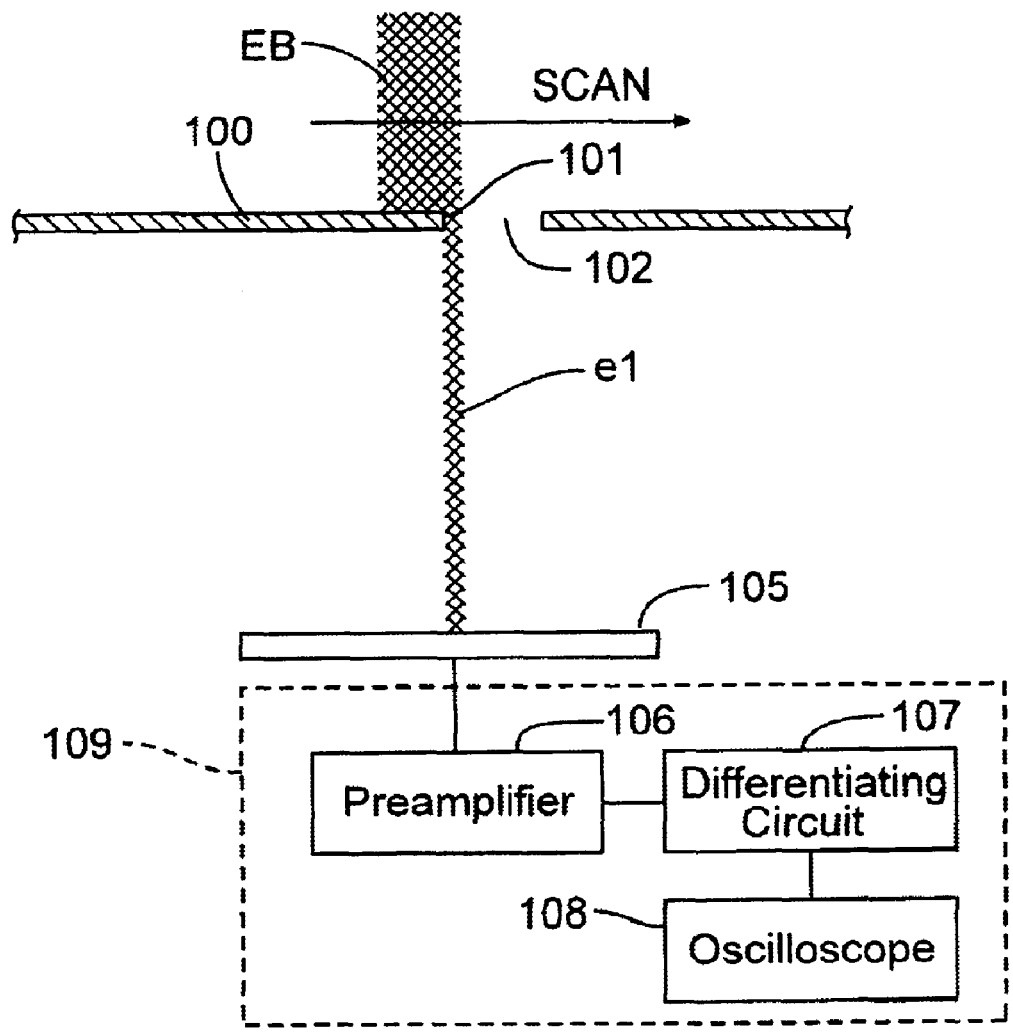
FIG. 7 is a schematic elevational view (with sections and associated block diagram) depicting operation of a conventional beam-blur-measurement device.
Figures 8A, 8B:
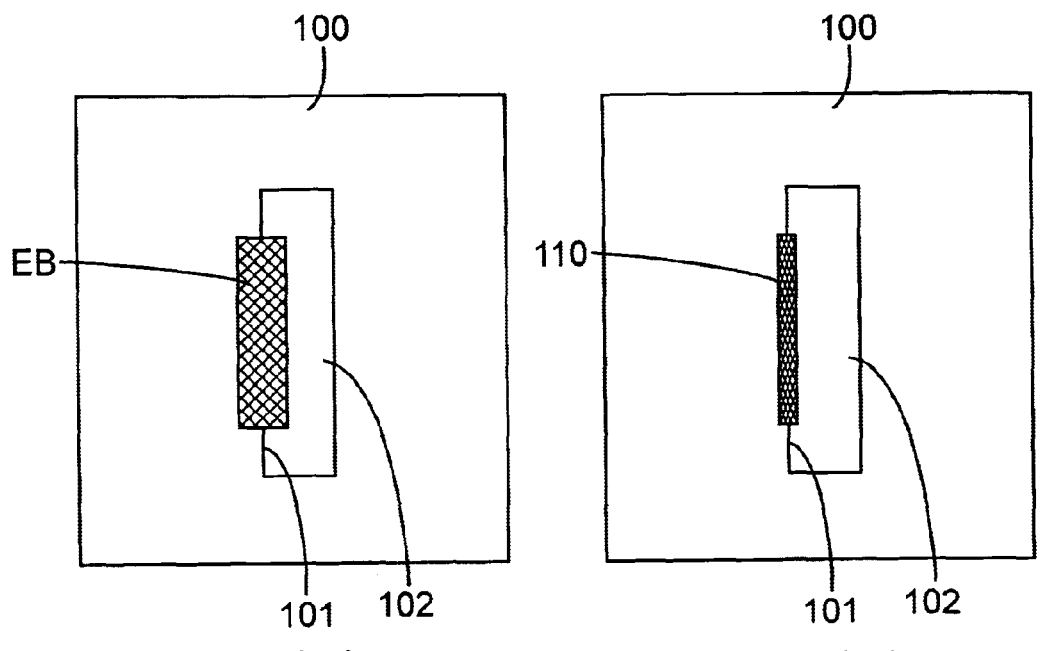

FIG. 6 is a schematic elevational section, with block diagram, depicting operation of the beam-blur-measurement system of this embodiment. A portion of a thin, flat, knife-edged plate 2 is shown at the most upstream portion of the figure. Also, only one opening 3 (see FIG. 4) formed in the knife-edged plate 2 is shown in the figure. The electron beam EB, shaped by passage through a measurement opening 13 on the reticle 11 (see FIG. 2) to have a rectangular transverse profile, irradiates the opening 3.

The first beam-limiting apertures 4 and the second beam-limiting apertures 5 are disposed downstream of the respective openings 3, and the electron detector (sensor) 6 is disposed downstream of the second beam-limiting apertures 5. The detector 6 is connected to a preamplifier 7, a differentiating circuit 8, and an oscilloscope 9 (or other suitable display).

As the shaped electron beam EB is scanned over a knife-edge 1 of the opening defined in the knife-edged plate 2, any electrons not absorbed by the knife-edged plate 2 pass through downstream. These electrons that are not absorbed include non-scattered electrons e1 that have passed directly through the opening 3 as well as electrons e2 that have passed through the plate 2 while experiencing one or more forward-scattering events. The electrons e1, e2 propagate to the beam-limiting apertures 4, 5, where the non-scattered electrons e1 pass through the apertures 4, 5, but almost all the scattered electrons e2 are blocked. As a result of these limitations to downstream propagation of the electrons, the detector 6 detects, almost exclusively, the non-scattered electrons e1, thereby producing a very high-contrast signal.

Figure 1:
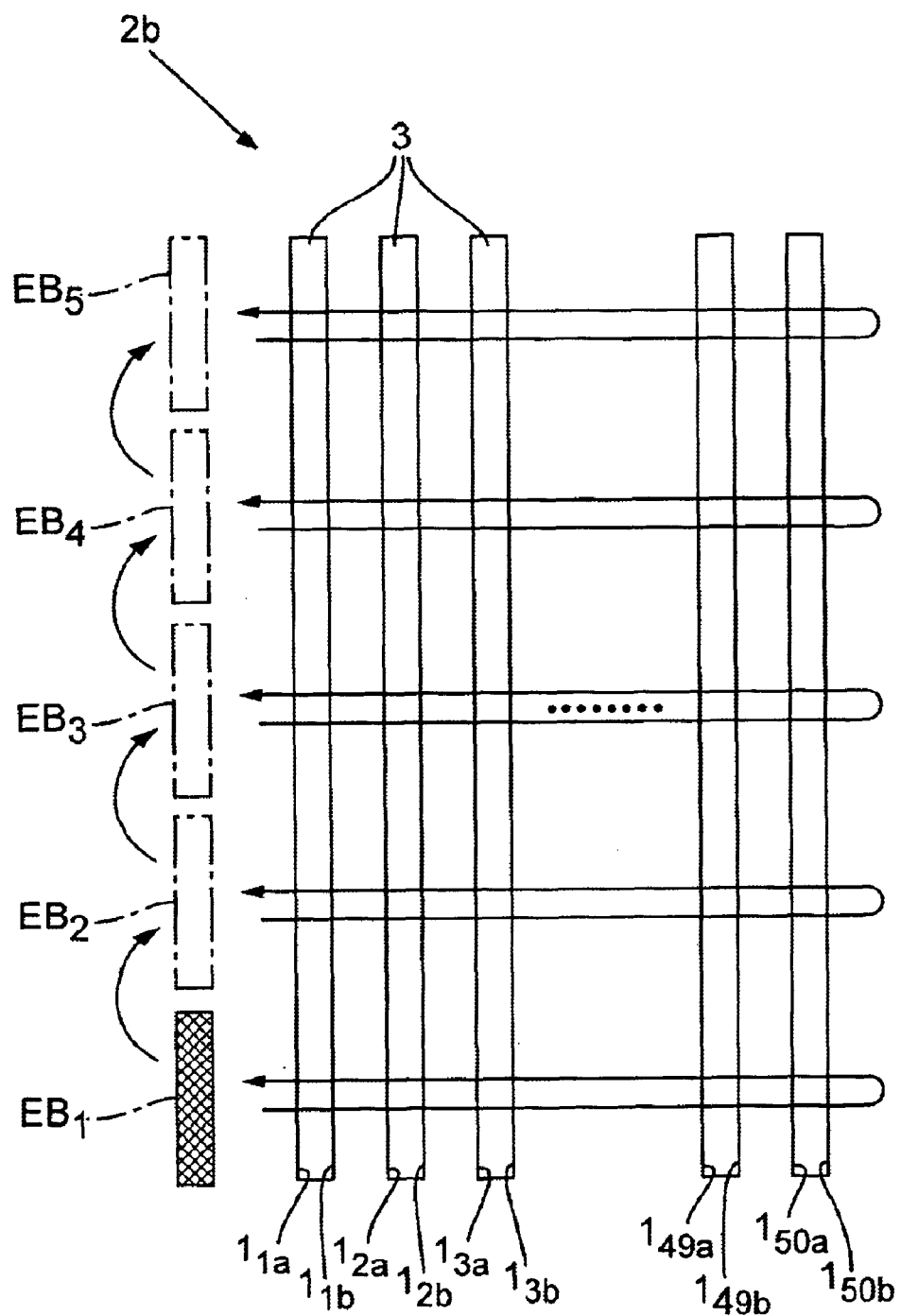
FIG. 1 is a plan view showing certain details of a representative embodiment of a method, as disclosed herein, for measuring the imaging performance of a charged-particle-beam (CPB) microlithography system.

An embodiment of a method for measuring the imaging performance of a CPB microlithography system is now described with reference to FIG. 1, which depicts one of the knife-edged pattern regions 2b of the knife-edged plate 2 shown in FIG. 4. The knife-edged pattern region 2b includes multiple openings 3 each having a width of 0.4 μm and a length (longitudinal direction) of 50 μm. Not all the 50 openings 3, arranged in a row, are shown in the figure. The respective left and right longitudinal edges of each opening 3 are knife-edges 1, which have reference numerals $1_{1a}$, $1_{1b}$, $1_{2a}$, $1_{2b}$, $1_{3a}$, $1_{3b}$, ..., $1_{49a}$, $1_{49b}$, $1_{50a}$, $1_{50b}$, starting from the left edge of the leftmost opening 3 in the figure.

The electron beam EB (shaped to have a rectangular transverse profile due to passage through the rectangular opening in the reticle; see FIG. 2) is shown to the left of the leftmost opening 3 in the figure. The longitudinal dimension of the beam EB desirably is shorter (by an integer factor) than the longitudinal dimension of the openings 3. This allows the beam EB to be shifted in the longitudinal direction during successive scans over the openings 3, so as not to scan repeatedly over the same locations on the knife-edges. Thus, in FIG. 1 five "beams" $EB_1$–$EB_5$ are shown, vertically aligned with each other. Each "beam" $EB_1$–$EB_5$ has a width of 0.4 μm and a length (in the vertical direction in the figure) of 10 μm. The "beams" $EB_1$–$EB_5$ do not represent multiple beams per se, but rather actually denote the beam EB shifted in the longitudinal direction, as noted above, to five respective locations.

When measuring imaging performance, first, the knife-edge $1_{1a}$ is scanned with the beam $EB_1$. Scanning of the beam $EB_1$ then progresses in turn to each of the other knife-edges, and back again (note arrow). The portion of the beam $EB_1$ passing through the successive openings 3 is detected by the electron detector 6 (FIG. 6). The resulting signal is processed, thereby providing a measurement of the characteristics of the beam. If this measurement were to be performed multiple times with the "beam" $EB_1$ being scanned only across the single knife-edge $1_{1a}$ in the conventional manner, then contaminant accumulation would be evident on the knife-edge $1_{1a}$. Hence, according to this embodiment, beam scanning progresses to the adjacent knife-edge $1_{1b}$ before the knife-edge $1_{1a}$ experiences any significant radiation-induced contamination. As the beam scans sequentially from one knife-edge to the next (i.e., $1_{1a}$ to $1_{1b}$, ..., to $1_{50b}$), respective beam-blur measurements are provided at each of 100 places.

Also, in this embodiment, the longitudinal dimension (50 μm) of each opening 3 is about five times the longitudinal dimension of the beam EB. As a result, with successive scans, the beam is shifted from $EB_1$ to $EB_2$, then to $EB_3$, then to $EB_4$, and finally to $EB_5$. Thus, five separate measurement locations are provided on each knife-edge $1_{1a}$–$1_{50b}$. In other words, measurements are performed five times on each of the 100 knife-edges $1_{1a}$–$1_{50b}$, resulting in beam measurements being performed 500 times with any one of the knife-edged pattern regions 2b. As shown in FIG. 4, since respective knife-edged pattern regions 2b are provided at 64 locations on a single knife-edged plate 2, a total of 32,000 measurements can be performed (500 times×64 places) using the knife-edged plate 2.

As is clear from the above description, by providing multiple knife-edges 1 on a single knife-edged plate 2, no single knife-edge experiences excessive radiation or radiation-induced contamination. Also, by making each of the knife-edges 1 longer than the corresponding longitudinal dimension of the beam EB, the measurement locations on each knife-edge is changed before significant contamination accumulates at any measurement location on a knife-edge 1 due to beam irradiation. Consequently, beam measurements always can be performed at a high level of performance.

Furthermore, each knife-edge 1 desirably is a respective longitudinal edge of a rectangular opening formed in a thin-film. By placing at least one beam-limiting aperture 4, 5 downstream of the opening in the thin film, charged particles scattered by the respective knife-edges 1 are blocked, thereby allowing passage to the sensor 6 only of those charged particles that pass through the knife-edged plate 2 without being absorbed or scattered. By thus measuring only non-scattered beam current passing through the at least one beam-limiting aperture 4, 5, beam-blur measurements are made at high accuracy and contrast. The number of measurement locations can be increased further by providing numerous beam-limiting apertures within the measurement apparatus.

As a result of providing many knife-edge regions for making beam-blur measurements, no single region of a knife-edge experiences significantly rapid accumulation of radiation-induced contamination. This allows extremely precise beam-blur measurements to be performed over a long period of time, compared to conventional beam-blur measurement devices. Also, the frequency with which knife-edge replacements must be performed is substantially reduced compared to conventional devices. Thus, it now is possible to maintain optimal adjustment of the beam in a CPB microlithography system at all times.

Whereas the invention has been described in connection with representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. In a charged-particle-beam (CPB) microlithography method in which a pattern is transferred from a reticle to a lithographic substrate by projecting a charged particle beam, carrying an image of the pattern, through a CPB optical system to the substrate on which the beam is focused so as to imprint an image of the pattern on the substrate, a method for measuring beam blur, comprising the steps:

disposing a reticle, defining a measurement opening, at an object plane of the CPB optical system, the measurement opening having a longitudinal dimension that, as the charged particle beam passes through the measurement opening, provides the beam with a longitudinal transverse dimension;

disposing a knife-edged plate at an image plane of the CPB optical system, the knife-edged plate defining at least one of (a) at least one knife-edged opening having longitudinal edges dimensioned at least 2× the longitudinal dimension of the charged particle beam, wherein each longitudinal edge has a respective knife-edge, and (b) multiple knife-edged openings each having respective longitudinal edges dimensioned at least as long as the longitudinal dimension of the charged particle beam, wherein each longitudinal edge has a respective knife-edge;

directing a charged particle beam through the measurement opening and through a selected region of the knife-edged opening, while scanning the beam across at least a portion of the respective longitudinal edges;

detecting the charged particle beam propagating downstream of the knife-edged opening so as to obtain data concerning a blur characteristic of the beam; and before any significant radiation-induced contamination has accumulated on a just-scanned knife-edge, shifting the charged particle beam such that the beam (a) is scanned across a different portion of the respective longitudinal edges in a subsequent scan, or (b) is scanned across the respective longitudinal edges of a different knife-edged opening in a subsequent scan, respectively.

2. The method of claim 1, wherein the at least one knife-edged opening is a respective longitudinally extended opening defined in a thin film of silicon.

3. The method of claim 2, further comprising the steps of:

disposing at least one beam-limiting-aperture plate between the knife-edged opening and the sensor, the beam-limiting-aperture plate defining at least one beam-limiting aperture situated and configured to pass substantially only charged particles of the beam that were not scattered upon passing through the thin film of silicon; and passing the beam, that has passed through a knife-edged opening, through the beam-limiting aperture to the sensor.

4. The method of claim 3, wherein the beam-limiting-aperture plate defines a respective beam-limiting aperture corresponding to each knife-edged opening.

5. The method of claim 3, wherein the step of disposing at least one beam-limiting-aperture plate comprises disposing multiple beam-limiting-aperture plates in tandem between the knife-edged opening and the sensor.

6. The method of claim 1, further comprising the steps of: disposing at least one beam-limiting-aperture plate between the knife-edged opening and the sensor, the beam-limiting-aperture plate defining at least one beam-limiting aperture situated and configured to pass substantially only non-scattered charged particles of the beam passing through the knife-edged opening; and passing the beam, that has passed through a knife-edged opening, through the beam-limiting aperture to the sensor.

7. The method of claim 6, wherein the beam-limiting-aperture plate defines a respective beam-limiting aperture corresponding to each knife-edged opening.

8. The method of claim 6, wherein the step of disposing at least one beam-limiting-aperture plate comprises disposing multiple beam-limiting-aperture plates in tandem between the knife-edged opening and the sensor.

9. In a charged-particle-beam (CPB) microlithography system used for transferring a pattern from a reticle to a lithographic substrate by projecting a charged particle beam, carrying an image of the pattern, through a CPB optical system to the substrate on which the beam is focused so as to imprint an image of the pattern on the substrate, a beam-blur-measurement device, comprising:

a reticle, defining a measurement opening, situated at an object plane of the CPB optical system, the measurement opening having a longitudinal dimension that, as the charged particle beam passes through the measurement opening, provides the beam with a longitudinal transverse dimension;

a knife-edged plate situated at an image plane of the CPB optical system, the knife-edged plate defining at least one of (a) at least one knife-edged opening having longitudinal edges dimensioned at least 2× the longitudinal dimension of the charged particle beam, wherein each longitudinal edge has a respective knife-edge, and (b) multiple knife-edged openings each having respective longitudinal edges dimensioned at least as long as the longitudinal dimension of the charged particle beam, wherein each longitudinal edge has a respective knife-edge; and a sensor situated downstream of the knife-edged plate so as to detect the charged particle beam that has passed through the measurement opening and through a knife-edged opening as the beam is being scanned over a knife-edged opening.

10. The device of claim 9, further comprising at least one stage of a beam-limiting-aperture plate situated between the knife-edged plate and the sensor, the beam-limiting-aperture plate defining at least one beam-limiting aperture situated and configured to pass substantially only non-scattered charged particles of the beam passing through the knife-edged opening.

11. The device of claim 9, wherein the at least one knife-edged opening is a respective longitudinally extended opening defined in a thin film of silicon.

12. The device of claim 11, further comprising at least one beam-limiting-aperture plate between the knife-edged opening and the sensor, the beam-limiting-aperture plate defining at least one beam-limiting aperture situated and configured to pass substantially only charged particles of the beam that were not scattered upon passing through the thin film of silicon.

13. The device of claim 9, wherein the knife-edged plate defines multiple sets of at least one knife-edged opening per set, each opening having longitudinal edges dimensioned at least 5× longer than the longitudinal dimension of the charged particle beam.

14. The device of claim 9, wherein the knife-edged plate defines multiple sets of multiple knife-edged openings each having respective longitudinal edges dimensioned at least 2× longer than the longitudinal dimension of the charged particle beam.

15. A CPB microlithography apparatus, comprising a beam-blur-measurement device as recited in claim 9.

16. A charged-particle-beam (CPB) microlithography system, comprising:

a projection-optical system configured to be situated between a reticle and a lithographic substrate and to project an image of a pattern, defined on the reticle, onto the substrate;

a wafer stage situated downstream of the projection-optical system and configured to hold the substrate during lithographic exposure with the charged particle beam passing through the projection-optical system; and a beam-blur-measurement device, comprising (i) a knife-edged plate situated at an image plane of the projection-optical system and configured to receive a charged particle beam that has been trimmed to have a longitudinal transverse dimension, the knife-edged plate defining at least one of (a) at least one knife-edged opening having longitudinal edges dimensioned at least 2× the longitudinal dimension of the charged particle beam, wherein each longitudinal edge has a respective knife-edge, and (b) multiple knife-edged openings each having respective longitudinal edges dimensioned at least as long as the longitudinal dimension of the charged particle beam, wherein each longitudinal edge has a respective knife-edge; and (ii) a sensor situated downstream of the knife-edged plate so as to detect the charged particle beam that has passed through the measurement opening and through a knife-edged opening as the beam is being scanned across a knife-edged opening.

17. The system of claim 16, wherein the beam-blur-measurement device further comprises at least one stage of a beam-limiting-aperture plate situated between the knife-edged plate and the sensor, the beam-limiting-aperture plate defining at least one beam-limiting aperture situated and configured to pass substantially only non-scattered charged particles of the beam passing through the knife-edged opening.

18. The system of claim 16, wherein the beam-blur-measurement device further comprises processing means connected to the sensor, the processing means being configured to calculate an imaging characteristic of the charged particle beam based on data provided by the sensor to the processing means.

19. The system of claim 16, further comprising a measurement reticle, defining a measurement opening, situated at an object plane of the CPB optical system, the measurement opening having a longitudinal dimension that, as the charged particle beam passes through the measurement opening, provides the beam with a longitudinal transverse dimension.

20. In a charged-particle-beam (CPB) microlithography system used for transferring a pattern from a reticle to a lithographic substrate by projecting a charged particle beam, carrying an image of the pattern, through a CPB optical system to the substrate on which the beam is focused so as to imprint an image of the pattern on the substrate, a beam-blur-measurement device, comprising:

a reticle, defining a measurement opening, situated at an object plane of the CPB optical system, the measurement opening having a longitudinal dimension that, as the charged particle beam passes through the measurement opening, provides the beam with a longitudinal transverse dimension;

a knife-edged plate situated at an image plane of the CPB optical system, the knife-edged plate defining at least one of (a) at least one knife-edged opening having longitudinal edges dimensioned at least 2× the longitudinal dimension of the charged particle beam, wherein each longitudinal edge has a respective knife-edge, and (b) multiple knife-edged openings each having respective longitudinal edges dimensioned at least as long as the longitudinal dimension of the charged particle beam, wherein each longitudinal edge has a respective knife-edge;

sensor means situated downstream of the knife-edged plate and configured to detect the charged particle beam that has passed through the measurement opening and through a knife-edged opening as the beam is being scanned across a knife-edged opening; and beam-blur measurement means for measuring, from data provided by the sensor means to which the beam-blur measurement means is connected, blur of the beam.

* * * * *